(12) United States Patent
Elsheref et al.

(10) Patent No.: US 7,045,798 B2
(45) Date of Patent: May 16, 2006

(54) CHARACTERIZING AN ELECTRON BEAM TREATMENT APPARATUS

(75) Inventors: Khaled A. Elsheref, San Jose, CA (US); Alexandros T. Demos, Fremont, CA (US); Hichem M'saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 119 days.

(21) Appl. No.: 10/784,315

(22) Filed: Feb. 20, 2004

(65) Prior Publication Data

US 2005/0184257 A1 Aug. 25, 2005

(51) Int. Cl.
*G01N 25/00* (2006.01)
*H01L 21/00* (2006.01)
*H01J 37/30* (2006.01)

(52) U.S. Cl. .............. 250/492.2; 250/306; 250/307; 250/310; 250/492.1; 250/492.3

(58) Field of Classification Search .............. 250/306, 250/307, 310, 492.1, 492.2, 492.3
See application file for complete search history.

(56) References Cited

U.S. PATENT DOCUMENTS

| | | | | |
|---|---|---|---|---|
| 4,579,463 A | * | 4/1986 | Rosencwaig et al. | 374/57 |
| 4,634,290 A | * | 1/1987 | Rosencwaig et al. | 374/5 |
| 4,636,088 A | | 1/1987 | Rosencwaig et al. | 374/5 |
| 4,854,710 A | * | 8/1989 | Opsal et al. | 356/432 |
| 5,003,178 A | | 3/1991 | Livesay | 250/492.3 |
| 5,074,669 A | | 12/1991 | Opsal | 356/445 |
| 5,861,632 A | | 1/1999 | Rohner et al. | |
| 6,407,399 B1 | | 6/2002 | Livesay | 250/492.3 |
| 6,555,831 B1 | | 4/2003 | Konishi et al. | |
| 6,583,876 B1 | * | 6/2003 | Opsal et al. | 356/369 |
| 2003/0081725 A1 | | 5/2003 | Opsal et al. | |
| 2003/0022763 A1 | | 12/2003 | Roberts et al. | |

FOREIGN PATENT DOCUMENTS

JP  05 074730  3/1993

* cited by examiner

*Primary Examiner*—Nikita Wells
(74) *Attorney, Agent, or Firm*—Janah & Associates

(57) ABSTRACT

One embodiment of the present invention is a method for characterizing an electron beam treatment apparatus that includes: (a) e-beam treating one or more of a predetermined type of wafer or substrate utilizing one or more sets of electron beam treatment para meters; (b) making post-electron beam treatment measurements of intensity of a probe beam reflected from the surface of the one or more wafers in which thermal and/or plasma waves have been induced; and (c) developing data from the post-electron beam treatment measurements that provide insight into performance of the electron beam treatment apparatus.

21 Claims, 7 Drawing Sheets

Mean : 82.1766   Std Dev. : 0.0968   (1.09%)
Min : 79.3641   Max : 03.8939   Range : 4.5298
Contor pos : (0.000, 0.000) mm   Size : 194.000 mm
Contour interval : 0.4109   (0.50%)

Mean : 492.8434   Std Dev. : 9.4339   (1.91%)
Min : 467.9317   Max : 505.4802   Range : 37.5485
Contor pos : (0.000, 0.000) mm   Size : 194.000 mm
Contour interval : 2.4642   (0.50%)

Mean : 408.3084   Std Dev. : 9.4471   (2.31%)
Min : 382.4769   Max : 422.5490
Contor pos : (0.000, 0.000) mm   Size : 194.000 mm
Contour interval : 4.0831   (1.00%)

CHARACTERIZING AN ELECTRON BEAM TREATMENT APPARATUS

TECHNICAL FIELD OF THE INVENTION

One or more embodiments of the present invention pertain to method and apparatus for characterizing an electron beam treatment apparatus.

BACKGROUND OF THE INVENTION

Fabrication of integrated devices, for example, and without limitation, semiconductor integrated devices, is complicated and, due to increasingly stringent requirements on device designs due to demands for greater device speed, fabrication is becoming ever more complicated. For example, integrated circuit geometries have decreased in size substantially since such devices were first introduced several decades ago. Since then, integrated circuits have generally followed a two year/half-size rule (often called Moore's Law), which means that the number of devices on a chip doubles every two years. Today's fabrication facilities are routinely producing devices having 0.13 µm feature sizes, and tomorrow's facilities soon will be producing devices having even smaller feature sizes. In addition, integrated circuits are being layered or stacked with ever decreasing insulating thickness between each circuitry layer.

In the production of advanced integrated circuits that have minimum feature sizes of 0.13 µm and below, problems of RC delay, power consumption, and crosstalk become significant. For example, device speed is limited in part by the RC delay which is determined by the resistance of metals used in the interconnect scheme, and the dielectric constant of insulating dielectric material used between metal interconnects. In addition, with decreasing geometries and device sizes, the semiconductor industry has sought to avoid parasitic capacitance and crosstalk noise caused by inadequate insulating layers in the integrated circuits. One way to achieve the desired low RC delay and higher performance in integrated circuit devices involves the use of dielectric materials in the insulating layers that have a low dielectric constant (k).

As the required value for the dielectric constant of materials is decreased due to device performance demands, there are many different types of low-k materials that are being investigated to determine whether they can perform acceptably. Most of these candidates are porous materials that can be organic materials, inorganic materials, organic compositions that might include inorganic components, and so forth. Further, ongoing investigations are exploring electron beam treatment of such films to improve their properties and/or to lower their dielectric constant. For example, such electron beam treatment can lower the dielectric constant and improve mechanical properties.

As used herein, the term electron beam or e-beam treatment refers to exposure of a film to a beam of electrons, for example, and without limitation, a relatively uniform beam of electrons. The e-beam may be scanned across a wafer, or the e-beam may be sufficiently broad to encompass a substantial portion, or the entirety, of a wafer (to achieve higher throughput processing it is advantageous to use a large-area or flood beam electron source, to expose the whole substrate simultaneously). The energy of the e-beam during the exposure is such that substantially an entire thickness of a layer of material is exposed to electrons from the e-beam, or predetermined portions of the layer beneath the surface of the layer are exposed to electrons from the e-beam. The exposure may also be accomplished in steps of varying energy to enable the whole layer, or portions of the layer to be exposed at predetermined depths.

In general, it is desired to have a method for characterizing such an electron beam treatment apparatus, i.e., a method for determining one or more measures that might provide insight into its performance. Such a method of characterizing might be carried out before utilizing such an electron beam treatment apparatus in production to provide qualification assurance, and it might be carried out after the apparatus has been in production for some time to determine whether maintenance and/or repair is required. One such measure used today is a measure of electron beam uniformity. Typically, a method of determining electron beam uniformity entails measuring film shrinkage (related to film thickness) after electron beam treatment of coated wafers, and this entails studying shrinkage maps whose results may depend on electron beam energy, electron beam dose amounts, and/or wafer temperature. This is problematic because, among other things, the process of studying shrinkage maps consumes much time. As a result, this does not provide a practical method for determining a measure of electron beam uniformity.

In light of the above, there is a need to overcome one or more of the above-identified problems.

SUMMARY OF THE INVENTION

One or more embodiments of the present invention advantageously overcome one or more of the above-identified problems. In particular, one embodiment of the present invention is a method for characterizing an electron beam treatment apparatus that includes: (a) e-beam treating one or more of a predetermined type of wafer or substrate utilizing one or more sets of electron beam treatment parameters; (b) making post-electron beam treatment measurements of intensity of a probe beam reflected from the surface of the one or more wafers in which thermal and/or plasma waves have been induced; and (c) developing data from the post-electron beam treatment measurements that provide insight into performance of the electron beam treatment apparatus.

DETAILED DESCRIPTION

Advantageously, one or more embodiments of the present invention provide method and apparatus for characterizing an electron beam apparatus, i.e., method and apparatus for determining one or more measures that might provide insight into its performance. In addition, one or more further embodiments of the present invention provide a method for chamber-to-chamber matching of electron beam treatment apparatus that can also be utilized for hardware optimization relating to, for example and without limitation, different types of anodes.

As used herein, the term electron beam or e-beam treatment refers to exposure of a film to a beam of electrons, for example, and without limitation, a relatively uniform beam of electrons. The e-beam may be scanned across a wafer, or the e-beam may be sufficiently broad to encompass a substantial portion, or the entirety, of a wafer (to achieve higher throughput processing it is advantageous to use a large-area or flood beam electron source, to expose the whole substrate simultaneously). The energy of the e-beam during the exposure is such that substantially an entire thickness of a layer of material is exposed to electrons from the e-beam, or predetermined portions of the layer beneath the surface of the layer are exposed to electrons from the e-beam. The exposure may also be accomplished in steps of varying energy to enable the whole layer, or portions of the layer to be exposed at predetermined depths.

Figure 1:
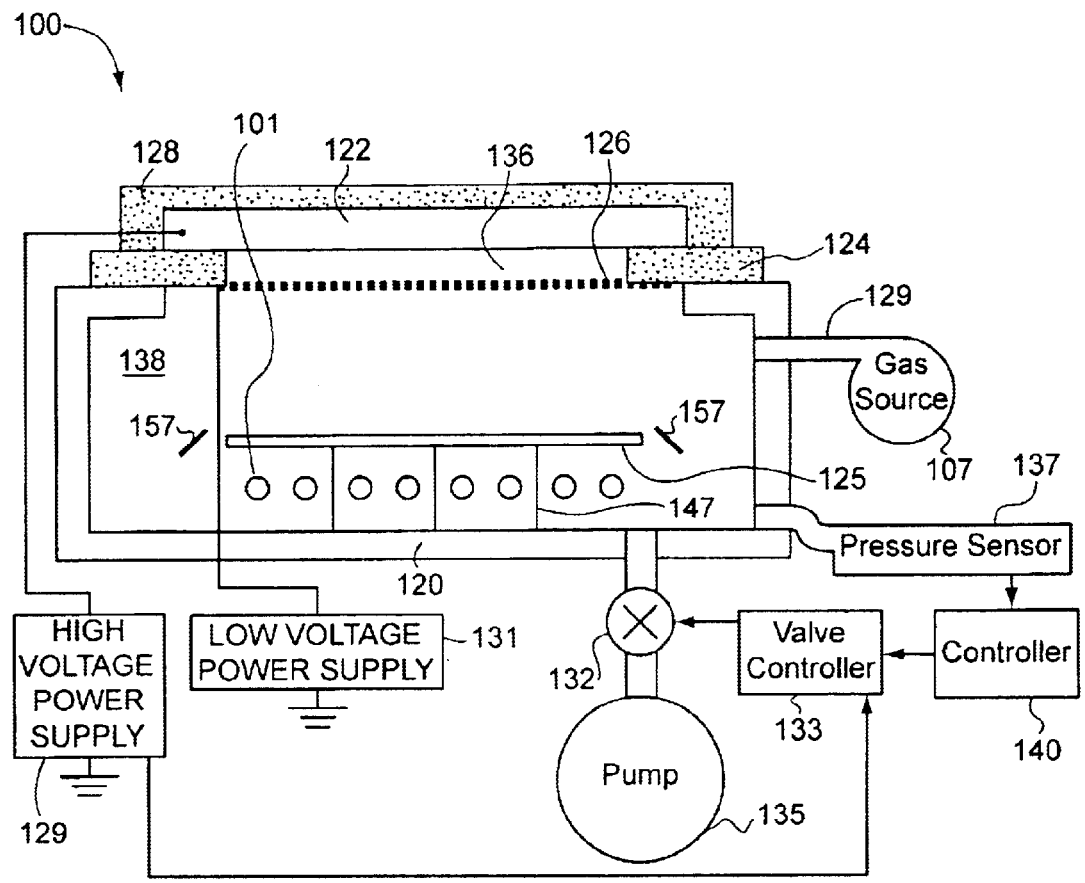
FIG. 1 shows a schematic diagram of a partial cross sectional view of an electron beam treatment apparatus that may be utilized to carry out one or more embodiments of the present invention.

FIG. 1 shows a schematic diagram of a partial cross sectional view of large area electron beam source, electron beam treatment apparatus 100 (e-beam apparatus 100) that may be utilized to carry out one or more embodiments of the present invention. Such an e-beam treatment apparatus is available from Applied Materials, Inc. of Santa Clara, Calif. As shown in FIG. 1, e-beam apparatus 100 includes array 101 of quartz halogen lamps for heating a substrate or a wafer, which array is surrounded by heat shield 157 to provide substantial temperature uniformity across a wafer, for example and without limitation, temperature uniformity to within at least 8° C. It should be understood that mechanisms for heating the substrate or wafer are not limited to the use of lamps. In accordance with further embodiments of e-beam apparatus 100, instead of utilizing lamps for heating, the wafer or substrate may be disposed on a body that is referred to as a chuck or susceptor. In accordance with such embodiments, the chuck may be resistively heated in a manner that is well known to those of ordinary skill in the art to provide heating independent of that provided by the electron beam. In addition, the chuck may be an electrostatic check (for example, a monopolar or bipolar electrostatic chuck) to provide good contact between the wafer and the chuck. Many methods are well known to those of ordinary skill in the art for fabricating such electrostatic chucks. Further in accordance with such embodiments, a backside gas may be flown between the wafer and the chuck to enhance thermal conductivity between the two in a manner that is well known to those of ordinary skill in the art, such backside gas being flown in one or more zones depending on the need for controlling temperature uniformity. Still further in accordance with such embodiments, a cooling liquid may be flown inside the chuck to be able, for some treatment mechanisms, to reduce the temperature of the wafer in light of heating provided by the electron beam. Many methods are well known to those of ordinary skill in the art for flowing a cooling liquid through a chuck. Indeed, it should be understood that embodiments of the present invention are not limited to the use of the e-beam apparatus shown in FIG. 1, and that further embodiments of the present invention may be fabricated utilizing any one of a number of other electron beam apparatus for developing suitable e-beams.

As further shown schematically in FIG. 1, substrate 125 is held over array 101 of lamps by pins 147, for example and without limitation, three (3) pins. In addition, such pins may include one or more thermocouples (not shown) to enable the temperature of substrate 125 to be monitored and controlled in accordance with any one of a number of mechanisms that are well known to those of ordinary skill in the art, for example and without limitation, using a chamber controller. In further addition, one of such pins may include a conductor to enable substrate 125 to be grounded. Pins 147 may be raised or lowered in a conventional matter, for example and without limitation, utilizing a lift plate assembly (not shown) to enable a conventional wafer transport robot and blade structure to move substrate 125 into and out of e-beam treatment apparatus 100.

Apparatus 100 is a type of e-beam apparatus like that disclosed in U.S. Pat. No. 5,003,178 (the '178 patent). Apparatus 100 utilizes various gases and operates at various values of cathode voltage, gas pressure, and working distance (i.e., a distance between the cathode and anode in a generation and acceleration region of the electron beam treatment apparatus, to be described below). As will be described below, such gases and appropriate values of cathode voltage, gas pressure, and working distance may be determined readily by one of ordinary skill in the art without undue experimentation. Co-pending patent application entitled "Improved Large Area Source for Uniform Electron Beam Generation" filed Nov. 21, 2002, Ser. No. 10/301,508 (which co-pending patent application and the present patent application are commonly assigned) and the '178 patent are incorporated by reference herein.

As shown in FIG. 1, e-beam treatment apparatus 100 includes vacuum chamber 120; large-area cathode 122 (for example, and without limitation, a cathode having an area in a range from about 4 square inches to about 700 square inches); and anode 126. As further shown in FIG. 1, anode 126 is disposed between substrate 125 (located in ionization region 138) and cathode 122. Anode 126 is disposed at a working distance from cathode 122 that is determined in a mariner to be described below.

As further shown in FIG. 1, electron source 100 further includes: (a) high-voltage insulator 124 that is disposed between cathode 122 and anode 126 and is operative to isolate cathode 122 from anode 126; (b) cathode cover insulator 128 that is located outside vacuum chamber 120 to provide electrical protection for users; (c) valved gas manifold 127 that has an inlet which is fabricated in accordance with any one of a number of methods that are well known to those of ordinary skill in the art to provide a mechanism for admitting gas into vacuum chamber 120 at one or more various input rates from gas source 107; (d) valve controller 133 that operates in response to signals from pressure sensor 137 and real time chamber controller 140 in a manner to be described below; (e) throttle valve 132 that operates in response to a signal from throttle valve controller 133 to control exhaust from vacuum chamber 120; (f) vacuum pump 135 (vacuum pump 135 may be any one or a number of commercially available vacuum pumps capable of pumping vacuum chamber 120 from atmospheric pressure to a pressure in a range between about 1 mTorr to about 200 mTorr such as, for example and without limitation, a turbo pump) that exhausts gas from chamber 120 through throttle valve 132 to control pressure inside vacuum chamber 120; (g) variable, high-voltage power supply 129 that is connected to cathode 122, and which supplies a signal to throttle valve controller 133 that provides a measure of e-beam current impinging upon substrate 125; and (h) variable, low-voltage power supply 131 that is connected to anode 126.

As shown in FIG. 1, a high voltage (for example, a negative voltage between: about −500 V and about −30 KV or higher) is applied to cathode 122 from variable, high-voltage power supply 129. In accordance with one embodiment of e-beam apparatus 100, high-voltage power supply 129 may be a Bertan Model #105-30R power supply manufactured by Bertan of Hicksville, N.Y., or a Spellman Model #SL30N-1200X 258 power supply manufactured by Spellman High Voltage Electronics Corp. of Hauppage, N.Y. Variable, low-voltage power supply 131 (for example, a d.c. power supply capable of sourcing or sinking current) is utilized to apply a voltage to anode 126 that is positive relative to the voltage applied to cathode 122. For example, the voltage applied to anode 126 may range from about 0 V to about −500 V. In accordance with one embodiment of e-beam apparatus 100, low-voltage power supply 131 may be an Acopian Model #150 PT12 power supply available from Acopian of Easton, Pa.

A wafer or substrate to be treated, such as substrate 125, is placed on pins 147. In accordance with one or more embodiments of e-beam apparatus 100, substrate 125 may be heated by a heating apparatus (for example and without limitation, a resistive heater disposed within a wafer or substrate holder in accordance with any one of a number of methods that are well known to those of ordinary skill in the art, or one or more infrared lamps such as array 101 of quartz halogen lamps) disposed to heat substrate 125 in accordance with any one of a number of methods that are well known to those of ordinary skill in the art. Some of the radiation output from lamps in an embodiment that utilizes lamps to provide heating may be reflected within chamber 120 to anode 126. Accordingly, in accordance with one or more such embodiments of e-beam apparatus 100, an internal portion of vacuum chamber 120 may be bead blasted, darkened, roughened, or anodized to reduce the coefficient of reflection of the internal portion of the chamber to be less than about 0.5. In this manner, a portion of the radiation output from the lamps may be absorbed by the internal portion of vacuum chamber 120.

Figure 3:
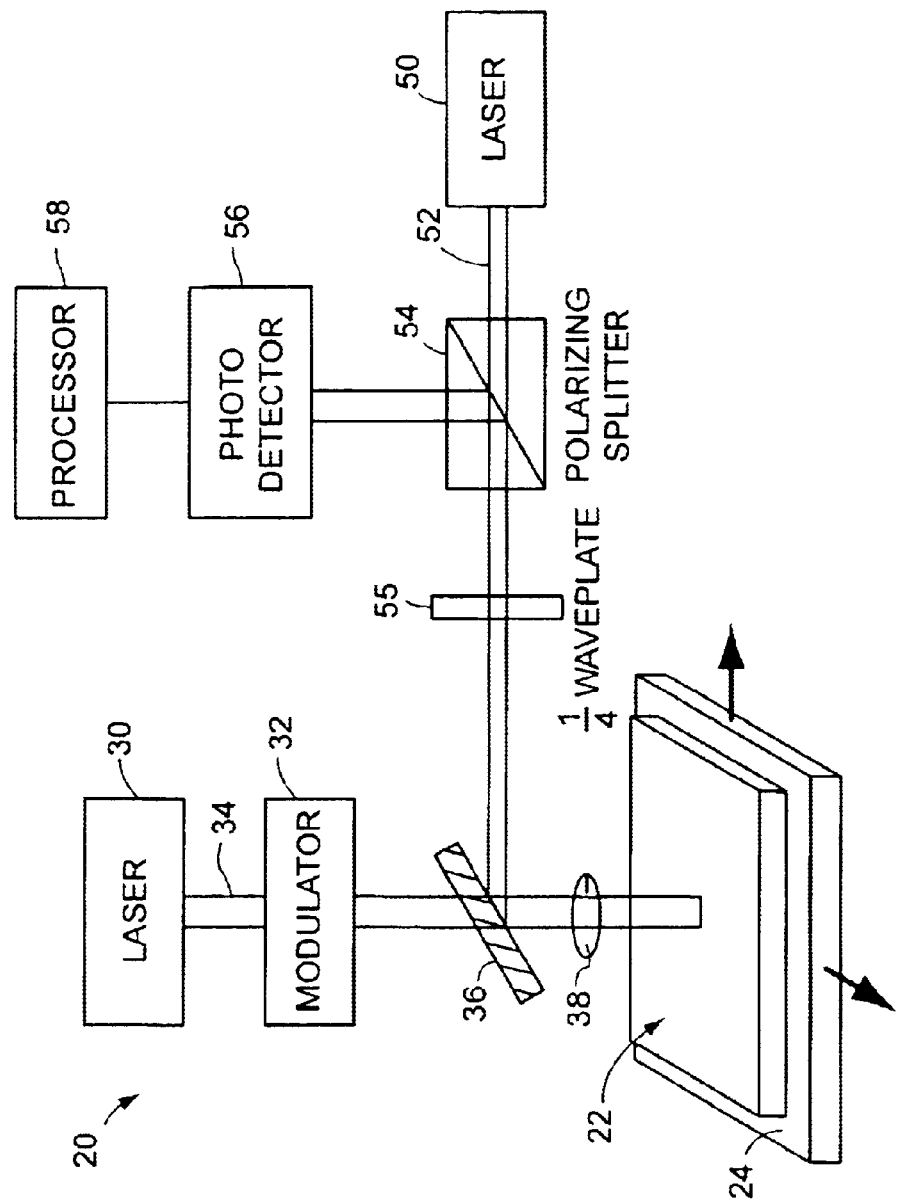
FIG. 3 shows a pictorial version of an apparatus that provides thermal wave and/or plasma wave measurements that is utilized to carry out one or more embodiments of the present invention.

Wafer 125 may be placed at a relatively large distance, such as, for example, and without limitation, 10 to 30 mm, from anode 126 to prevent electrons from casting an image of anode 126 on wafer 125. In addition, irradiation of wafer 125 may further entail sweeping the electron beam back and forth across wafer 125 by using, for example and without limitation, a time-varying magnetic field produced by deflection coils surrounding vacuum chamber 120 as shown in FIG. 3 of the '178 patent.

In accordance with one or more embodiments of e-beam apparatus 100, anode 126 may be fabricated (in whole or a surface thereof) from an electrically conductive material such as, for example, and without limitation, Al, Ti, Ni, Si, Mo, graphite, W, Co, and alloys of the foregoing. For treating films at relatively high temperatures, for example, temperatures in a range between about 200° C. and about 600° C., aluminum may provide a more suitable material than graphite. For example, aluminum generally has a higher thermal conductivity than graphite, and as a consequence, an anode formed from aluminum may bow less at high temperatures than one formed from graphite. In addition, aluminum has a lower emissivity than graphite, and this leads to lower heat transfer to the anode by radiation (for example, from wafer 125). In further addition, aluminum has a lower sputtering yield than graphite, thereby resulting in less contamination on wafer 125. It should be noted that in addition to anode 126 being made from aluminum, cathode 122 and vacuum chamber 122 may also be made from aluminum. However, the surface of cathode 122 may also be fabricated from Al, Ti, Ni, Si, Mo, graphite, W, Co and alloys of the foregoing.

Anode 126 may be, for example, and without limitation, a grid, a mesh or a plate having an array of holes disposed therethrough. For example, in accordance with one or more embodiments of e-beam apparatus 100, the size of the holes may be varied to compensate for a decrease in beam intensity that sometimes occurs at an edge of anode 126. In this manner, a more diametrically uniform electron beam may be-generated. For example, in accordance with one or more embodiments of e-beam apparatus 100, anode 126 comprises 37,500 holes with four concentric zones of different hole diameter, providing approximately 58% open area In using such an embodiment, electron beam uniformity may be tuned by hole diameter in each zone, with larger diameter holes disposed at the edge of at anode 126 where the tuning entails using film shrinkage uniformity or determining beam uniformity in accordance with one or more embodiments of the present invention as described below. Examples for the array of holes and methods for making the holes are described in more detail in U.S. Pat. No. 6,407,399 which patent is incorporated by reference herein.

In some applications, it is desirable to provide constant electron beam current during treatment. The electron beam current may vary because, among other things, processing may cause deposition of outgassed treatment by-products on chamber walls, the anode, and the cathode, and this may reduce electron generation efficiency.

Apparatus 100 shown in FIG. 1 may provide constant electron beam current during treatment as follows: (a) high voltage power supply 129 and low voltage power supply 131 are set to predetermined output voltage values for a particular application (typically, the voltages are set in response to input from real time chamber controller 140 in a conventional manner); (b) valved gas manifold 127 is set to provide a predetermined value of gas flow for a particular application (typically, the setting of a valve is set in response to input from real time chamber controller 140 in a conventional manner); (c) throttle valve controller 133 sends a signal to throttle valve 132 to cause it to provide a predetermined gas pressure in vacuum chamber 120 for a particular application (typically, throttle valve controller 133 operates in response to input from real time chamber controller 140 in a conventional manner); (d) real time controller 140 sends a signal to throttle valve controller 133 that represents a "current set point" for a particular application; (e) high voltage power supply 129 sends a signal to throttle valve controller 133 that represents a measure of electron beam current; and (f) throttle valve controller 133 causes the measure of electron beam current to match the "current set point" by sending signals to throttle valve 132 to open it or close it to control chamber pressure so as to maintain constant beam current. For example and without limitation, in accordance with one embodiment of apparatus 100, throttle valve 132 has a response time for opening or closing of about 130 ms. Typically, as a chamber gets dirty, the efficiency of electron production goes down, and to counteract this, the chamber pressure is increased to provide a constant electron beam. In accordance with one or more embodiments, the measure of electron beam current is determined by estimating that, for example and without limitation, a predetermined number of electrons produced at cathode 122 do not travel through anode 126 (for example, anode 126 may include a pattern of holes that transmits only ~60% of the electrons impinging thereon from cathode 122), and by estimating that a predetermined number of electrons (for example and without limitation, 10%) transmitted through anode 126 do not strike substrate 125 because the area anode 126 may be larger (for example and without limitation, 10% larger) than the area of substrate 125. As such, in accordance with one or more embodiments, the measure of electron beam current is determined by estimating that ~40% of the electrons leaving cathode 122 (measured by high voltage power supply 129) reach substrate 125. Such estimates may be experimentally verified by measurements utilizing graphite wafers or by measurements utilizing a Faraday cup in accordance with any one of a number of methods that are well known to those of ordinary skill in the art.

Figure 2:
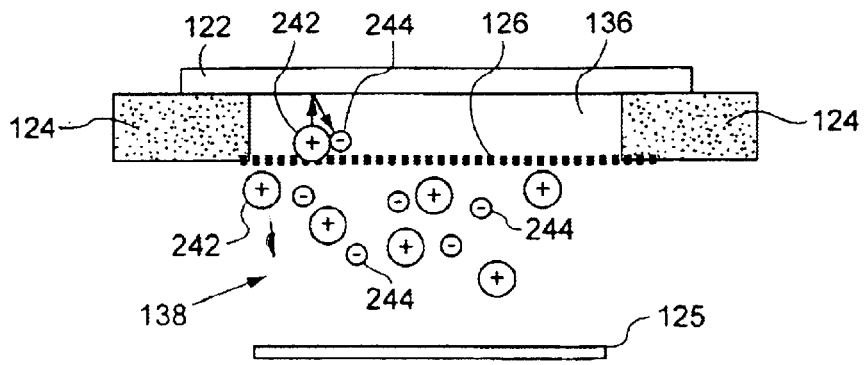
FIG. 2 shows a fragmentary view of the electron beam treatment apparatus of FIG. 1 which helps to illustrate some details of its operation.

FIG. 2 shows a fragmentary view of electron beam treatment apparatus 100 of FIG. 1 that helps to illustrate some details of its operation. To initiate electron emission in electron beam treatment apparatus 100, gas in ionization region 138 between anode 126 and wafer 125 must become ionized. In accordance with one or more embodiments of the present invention, the gas may include one or more of, for example, and without limitation, helium, argon, nitrogen, hydrogen, oxygen, ammonia, neon; krypton, and xenon. The step of ionizing the gas may be initiated by naturally occurring gamma rays, or it may be initiated by a high voltage spark gap disposed inside vacuum chamber 120 in accordance with any one of a number of methods that are well known to those of ordinary skill in the art.

Anode 126 is negatively biased by a voltage in a range, for example, from about 0 V to about −500 V that is applied thereto from low-voltage power supply 131. Once ionization is initialized, as shown in FIG. 2, positive ions 242 are attracted toward negatively biased anode 126. These positive ions 242 pass through holes in anode 126 into electron generation and acceleration region 136 between cathode 122 and anode 126. In region 136, positive ions 242 are accelerated toward cathode 122 as a result of a voltage (for example, a voltage in a range from about −500 V to about −30 KV or higher) that is applied thereto from high-voltage power supply 129. Upon striking the surface of cathode 122, positive ions 242 produce electrons 244 that are accelerated back toward anode 126. Some of electrons 244 strike anode 126, but many pass through anode 126, and continue on to impinge upon wafer 125. In addition, some of electrons 244 ionize gas molecules in ionization region 138.

The working distance between cathode 122 and anode 126 may be set to any value that is consistent with obtaining no arcing or breakdown in generation and acceleration region 136. This enables the presence of ions in generation and acceleration region 136 to be controlled by voltage applied to anode 126. In turn, this enables electron emission, and hence, electron beam current, to be controlled continuously from small currents to large currents by varying the voltage applied to anode 126. In addition, electron emission, and hence, electron beam current, can also be controlled by using throttle valve 132 to adjust the gas pressure in vacuum chamber 120 (raising or lowering the gas pressure, raises or lowers, respectively, the number of molecules in ionization region 138 and generation and acceleration region 136). As a result, in operation, one can utilize: (a) values of cathode voltage that are small enough to be useful in treating thin films; (b) values of gas pressure that are high enough to sustain electron beam current at such small values of cathode voltage; and (c) values of working distance that provide sufficient working tolerances to mitigate, for example, and without limitation, mechanical problems that might be caused by heating of chamber elements such as anode 126.

One can determine appropriate values of operation by routine experimentation as follows. First, chose a convenient working distance for the electron beam treatment apparatus. Next, select a value of cathode voltage that is determined by the energy of electrons required to treat a wafer. Next, while measuring the electron beam current (using, for example, a current detector disposed in series with high-voltage power supply 129), vary the gas pressure to sustain an effective, uniform electron beam. The current is measured to determine values of current that provide useful throughput (for example, and without limitation, electron beam current may range from about 1 mA to about 40 mA), and to ensure that the values of cathode voltage, gas pressure, and working distance used do not result in arcing or breakdown in generation and acceleration region 138 (breakdown may be evidenced by a faint plasma or arcing which can also be observed by voltage or current spiking at the cathode).

As shown in FIG. 1, array of lamps 101 irradiate and heat wafer or substrate 125, thereby controlling its temperature. Since wafer 125 is in a vacuum environment, and is thermally isolated, wafer 125 can be heated or cooled by radiation. If the lamps are extinguished, wafer 125 will radiate away its heat to the surrounding surfaces and gently cool. Wafer 125 is simultaneously heated by the lamps and irradiated by the electron beam throughout the entire process. For example, in accordance with one embodiment, array 101 of infrared quartz halogen lamps are on continuously until the temperature of wafer 125 reaches a process operating temperature. The lamps are thereafter turned off and on at a predetermined, and perhaps, varying duty cycle to control the wafer temperature.

We have discovered that thermal wave and/or plasma wave measurements made after, or before and after, electron beam treatment of a wafer provide output(s) that can be utilized to characterize an electron beam treatment apparatus. As such, and in accordance with one or more embodiments of the present invention, thermal wave and/or plasma wave measurements may be analyzed to determine measures that provide insight into, for example and without limitation, electron beam uniformity and electron beam performance at various electron beam energies, electron beam dose amounts, and wafer temperatures. Advantageously, in contrast to a method based on film shrinkage maps, analysis of thermal wave and/or plasma wave measurements can be done rapidly, and in some instances in an automated manner.

Methods for taking thermal wave and/or plasma wave measurements are well known in the art. For example, see U.S. Pat. Nos. 4,634,290; 4,636,088, 4,854,710 5,074,669, and 6,583,876, which patents are incorporated herein by reference. In a thermal wave system, localized periodic heating is induced at the surface of a wafer by energy output from a heat source. Energy absorbed by the wafer at or near its surface produces periodic surface heating that occurs at a modulation frequency of the heat source. This periodic surface heating is a source of thermal waves that propagate from the heated region. The thermal waves interact with thermal boundaries and barriers in a manner that is mathematically equivalent to scattering and reflection of conventional propagating waves. Thus, any features on or beneath the surface of the wafer that have thermal characteristics different from their surroundings will reflect and scatter thermal waves, and thus become visible to the thermal waves. Further, the changes in temperature produced by the thermal waves will result changes in the index of refraction at the surface of the wafer. Such changes in the index of refraction can be detected by reflecting a probe beam off the surface of the wafer within the area that has been excited. In particular, the probe beam that is reflected off the surface of the wafer will undergo periodic changes in intensity which can be measured, for example, by a photodetector.

In a like manner, density variations of a diffusing electron-hole plasma may be monitored to yield information about features in a semiconductor. In particular, a periodic energy is applied to the surface of a semiconductor wafer to generate a periodic electron-hole plasma. Typically, the energy will exceed the semiconductor band gap energy, and electrons will be excited from the valance band to an energy level above the conduction band to form electron-hole pairs. These electrons' will, in a relatively short period of time, give up a portion of their energy to the lattice through non-radiative transitions to unoccupied states near the bottom of the conduction band. After a much longer time, these carriers will give up the remainder of their energy to the lattice by recombining with the holes of the valence band. Prior to this recombination, there exists a plasma of electrons and holes whose spatial density is governed by diffusion in a manner analogous to the flow of heat from a thermal source. As the plasma diffuses, it interacts with various microscopic features in the wafer in a manner that is mathematically equivalent to scattering and reflection of conventional propagating waves. Any features on or beneath the surface of the sample that have electronic characteristics different from their surroundings will reflect and scatter the plasma waves, and thus alter the diffusion of the plasma waves. The diffusing plasma functions to change the index of refraction of the surface of the sample. The diffusion of the plasma is, in turn, a function of the local sample characteristics and thus the plasma induced changes in the index of refraction are also a function of these local sample characteristics. Such changes in the index of refraction can be detected in the same manner described above for changes in index of refraction caused by thermal waves. Note that the electron-hole plasma analysis is limited to semiconductor materials. Further note that thermal wave studies only provide information as to thermal features, whereas plasma density analysis will provide information on a wide variety of changes in structure and composition of a semiconductor sample. Still further, the sensitivity of the plasma to variations in some wafer characteristics can be anywhere from 10 to 100 times greater than that which would be expected from a thermal wave interaction alone.

FIG. 3 shows a pictorial representation of an apparatus that provides thermal wave and/or plasma wave measurements. As shown in FIG. 3, wafer or substrate 22 rests on platform 24 which is capable of movement in two orthogonal directions so that wafer 22 can be rastered with respect to excitation beam 34 and probe beam 52. In accordance with one or more further embodiments, platform 24 may include a stage (not shown) that can rotate wafer 22 about an axis perpendicular to its surface. Platform 24 can be fabricated in accordance with any one of a number of methods that are well known to those of ordinary skill in the art. As further shown in FIG. 3, pump laser 30 outputs intensity modulated beam 34. In accordance with one or more embodiments of the present invention, pump laser 30 is a diode laser that is intensity modulated, for example and without limitation, by excitation current modulation in accordance with any one of a number of methods that are well known to those of ordinary skill in the art. In accordance with one such embodiment, output beam 34: (a) has a wavelength spectrum that is centered at about 790 nm; (b) is intensity modulated at a frequency of about 1 MHz; and (c) has a maximum power of about 70 mW. Beam 34 may be passed through a beam expander (not shown).

As further shown in FIG. 3, beam 34 passes through dichroic mirror 36, and is focused by lens 38 to a spot on wafer 22. In accordance with one or more embodiments of the present invention, the spot has a diameter of, for example and without limitation, about 1 µm, and as such, it may generate an increase in temperature of about 10° C. In accordance with one or more alternative embodiments of an apparatus that provides thermal wave and/or plasma wave measurements, an intensity modulated heating source could be supplied by a source of intensity modulated electromagnetic radiation at various wavelengths such as, for example and without limitation, X-rays, gamma rays, infrared, ultraviolet, visible light, microwaves or radio frequencies or by a source of an intensity modulated stream of particles such as, for example and without limitation, electrons, protons, neutrons, ions or molecules.

As shown in FIG. 3, probe laser 50 outputs un-modulated beam 52. In accordance with one or more embodiments of the present invention, probe laser 52 is a diode laser, and in accordance with one such embodiment, output beam 52: (a) has a wavelength spectrum that is centered at about 670 nm; and (b) has a maximum power of about 10 mW. Various other sources of electromagnetic radiation may be used to provide probe beam 52 as long as such electromagnetic radiation is affected by temperature changes on the surface of wafer 22 in a mariner that can be measured. As further shown in FIG. 3, beam 52 passes through polarizing splitter 54. Polarizing splitter 54 is oriented so that radiation emanating from laser 50 passes freely therethrough, and so that radiation whose phase is rotated through 90° relative to beam 52 is deflected. As is further shown in FIG. 3, beam 52 passes through ¼λ-waveplate 55 which rotates the phase of the beam by 45°. Polarizing splitter 54 and ¼λ-waveplate 55 maybe fabricated in accordance with any one of a number of methods that are well known to those of ordinary skill in the art, or embodiments thereof may be commercially obtained. On the return path of beam 52 after reflection from wafer 22, ¼λ-waveplate 55 will rotate the phase of the beam another 45° so that when reflected beam 52 reaches polarizing splitter 54, the phase of beam 52 will have been rotated a total of 90° from its original incoming orientation. Because of this, polarizing splitter 54 will deflect reflected beam 52 to photodetector 56. After beam 52 initially passes through ¼λ-waveplate 55, it is reflected downwardly by dichroic mirror 36. Dichroic mirror 36 is designed to be transparent to radiation having wavelengths of beam 34, and to reflect radiation having wavelengths of beam 52. A suitable dichroic mirror may be designed in accordance with any one of a number of methods that are well known to those of ordinary skill in the art.

In accordance with this embodiment, and as shown in FIG. 3, beam 34 and beam 52 are aligned so that they are directed in a coincident manner down through lens 38, and are focused at the same spot on the surface of wafer 22—by focusing beam 52 and beam 30 at the same spot, a maximum signal output can be achieved. It is to be understood that reflectivity signals of interest exist at any area on the surface of wafer 22 that has been periodically heated by beam 34, therefore, beam 34 does not have to be directly coincident with beam 34 to detect signals of interest. Accordingly, lens 38 is not necessary for focusing either beam 34 or beam 52, rather, it is utilized to direct beam 52 within at least a portion of an area periodically heated by beam 34. Because the signals to be measured are small, it is useful to maximize the output for detection. Therefore, it would be desirable to direct probe beam 52 to be coincident with pump beam 34.

When wafer 22 absorbs energy from beam 34 at a spot at or near its surface, a periodic surface heating results which, in turn, generates thermal waves that propagate from the irradiated spot. These thermal waves have the same frequency as the modulation frequency of beam 34, and the wavelength of the thermal waves is determined both by the modulation frequency of beam 34 and by the thermal parameters of the wafer 22. The presence of thermal waves directly effects reflectivity at the surface of wafer 22. In particular, features and regions below the surface which alter the passage of thermal waves alter optical reflective patterns at the surface of the sample. It is believed that as beam 52 is reflected off the surface of wafer 22, it interacts with the lattice structure of wafer 22, which lattice structure undergoes periodic changes as the temperature of the sample changes periodically. Thus, it is believed that probe beam 52 essentially "sees" the changes of this lattice structure and "sees" the features and regions below the surface.

As shown in FIG. 3, probe beam 52 is reflected back up to dichroic mirror 36 where it is, in turn, reflected back along the incoming path and through ¼λ-waveplate 55. As discussed above, waveplate 55 rotates the phase of probe beam 52 by 45° such that when reflected beam 52 reaches polarizing splitter 54 its phase has been rotated 90° with respect to original beam 52. Accordingly, polarizing splitter 54 deflects reflected probe beam 52 upwardly towards photodetector 56 (an isolation filter that passes only radiation having wavelengths centered about 670 nm may precede photodetector 56 to block unwanted input). Photodetector 56 is designed in accordance with any one of a number of methods that are well known to those of ordinary skill in the art to measure the intensity of reflected probe beam 52. This result can be achieved by ensuring that reflected probe beam 52 underfills a surface of photodetector 56. This ensures that photodetector 80 measures only modulations in reflected intensity and is insensitive to small variations in diameter or position of probe beam 52 that are induced by thermal lens effects or thermo-elastic deformations at the surface of wafer 22. In response, photodetector 56 generates a voltage proportional to the intensity of the beam falling on its surface. As such, photodetector 56 outputs a signal that includes a thermal wave (TW) signal, i.e., a signal having an AC component at about 1 MHz, and a DC component. Since intensity variations of a radiation beam are to be detected, a standard photodetector may be employed as a sensing mechanism. The intensity signal is proportional to the reflected power of probe beam 52, and is therefore, indicative of the varying optical reflectivity of the surface of wafer 22. In response, processor 58 provides a TW signal based on the changing surface temperature to conditions as indicated by the changing output signal. The output signal from photodetector 56 may be filtered, for example and without limitation, by passing the signal through a narrow bandwidth filter, to isolate changes which are synchronous with the modulation frequency of pump beam 34. Lastly, stage 24 enables movement of wafer 22 with respect to pump beam 34 and probe beam 52 so that a two-dimensional thermal wave image may be generated. It is also known that thermal wave effects can be measured with probes other than probe beam 52. For example and without limitation, thermal wave effects may be measured acoustically.

In accordance with one or more embodiments of the present invention, the apparatus shown in FIG. 3 may generate plasma waves in a semiconductor as well as thermal waves. However, the frequency of intensity modulation of laser beam 34 (or its equivalent forms as described above such as, for example and without limitation, any source of electromagnetic radiation or particle beams such as an electron beam) determines whether plasma waves will be generated. A threshold frequency for forming plasma waves is a function of the time it takes for electron-hole pairs to recombine in the semiconductor. If the recombination time is shorter than the time of each laser pulse, any wave action will die out. However, if a plasma state exists for a time longer than the period of the modulation frequency, a wave-like phenomenon will be observed. Thus, in order to ensure that plasma waves are generated, the modulation frequency should be set such that the modulation period is less, and preferably much less, than the recombination time of the plasma. In a typical semiconductor sample of silicon, the recombination time is on the order of $10^{-5}$ seconds. Therefore, it is desirable to set the modulation frequency of the energy beam to be on the order of one (1) MHz to 100 MHz. In addition, the wavelength of laser beam 34 must be low enough to excite electrons from the valence band to the conduction band of the semiconductor, which wavelength is a function of the type of semiconductor being analyzed. If the wavelength of laser beam 34 is lower than necessary, electrons will be excited above the band gap and then rapidly drop down to the lowest energy level of the conduction band. In this case, heat will be generated and thermal waves may also be induced. Note that when electrons eventually drop from the conduction band to the valence band, i.e., when electrons and holes recombine, additional heat may be released. In a situation where the laser wavelength is sufficient to generate electron-hole pairs, a plasma will be created which diffuses through the semiconductor and which will affect the index of refraction of the semiconductor. More important, surface and subsurface features in the semiconductor will affect the movement or diffusion of the plasma and thereby alter its local density and cause changes to the index of refraction. As was described above with respect to thermal waves, in order for probe 52 to "see" the effects of the plasma, it must be directed within the periodically excited area. Then, as the refractive index of the sample undergoes periodic changes as the plasma density changes periodically, probe beam 52 "sees" the changes of the index of refraction induced by the density changes of the plasma such that the intensity of probe beam 52 is altered. As was described above, processor 58 provides an output that provides a measure of the intensity of reflected probe beam 52.

Thermal wave and/or plasma wave measurements may be provided in accordance with the above-described principles by a Therma-Probe® monitor tool that is available from the Thermawave Corporation of Fremont, Calif., which tool has typically been utilized in the prior art to monitor implant processes. However, in accordance with one or more embodiments of the present invention, such as tool may be utilized to provide information useful in characterizing an electron beam treatment apparatus. In accordance with one or more embodiments of the present invention, useful output from the Therma-Probe® monitor tool includes a measure of reflected probe beam intensity (typically the Therma-Probe® monitor tool provides such a measure in units referred to as Thermal Wave or TW units —regardless of whether the measurements reflect production of thermal and/or plasma waves).

Figure 4:
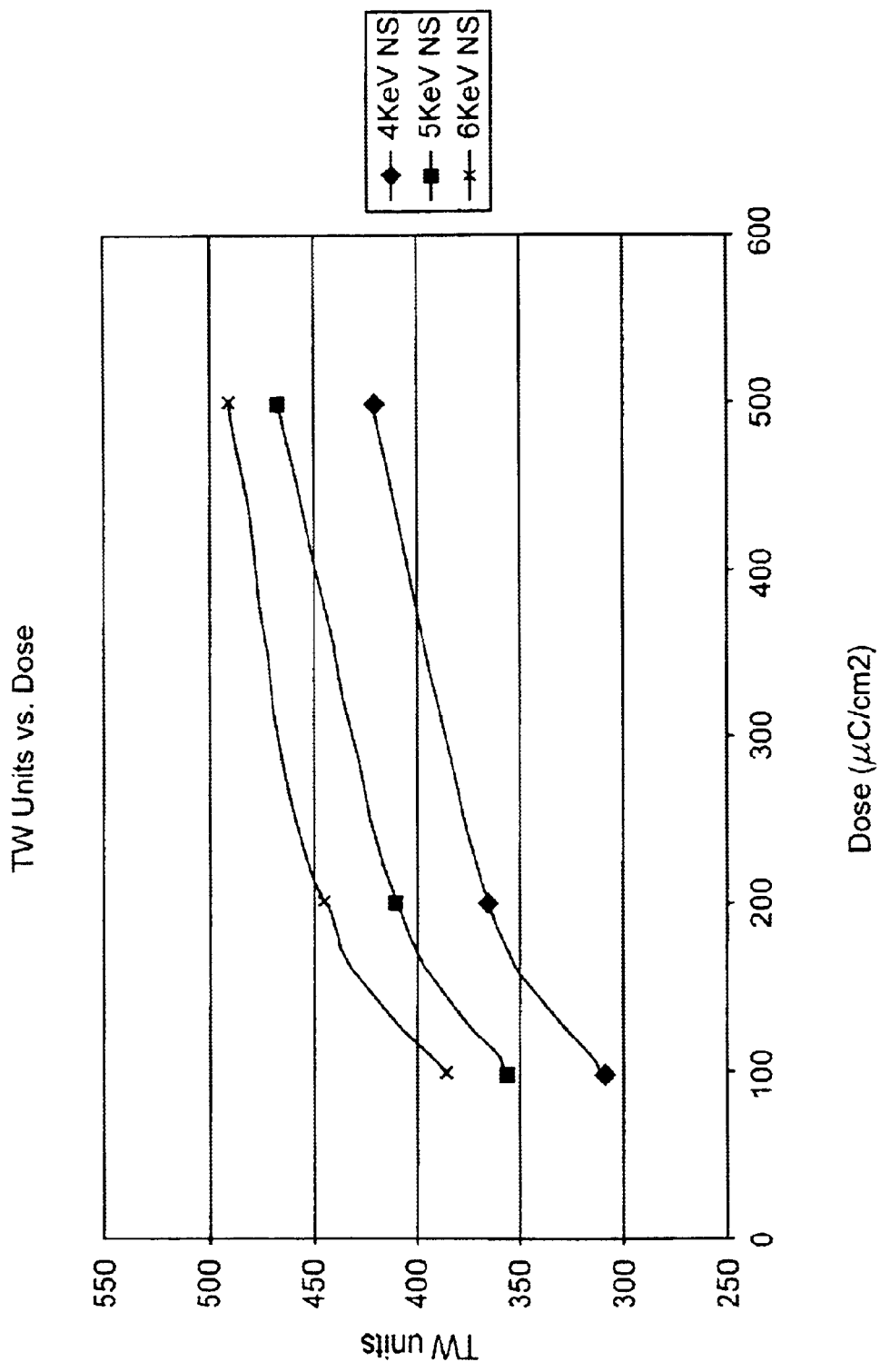
FIG. 4 shows curves of mean values of measurements made by a Therma-Probe® monitor tool on electron beam treated wafers as a function of electron beam dose at different values of cathode voltage.
Figure 5:
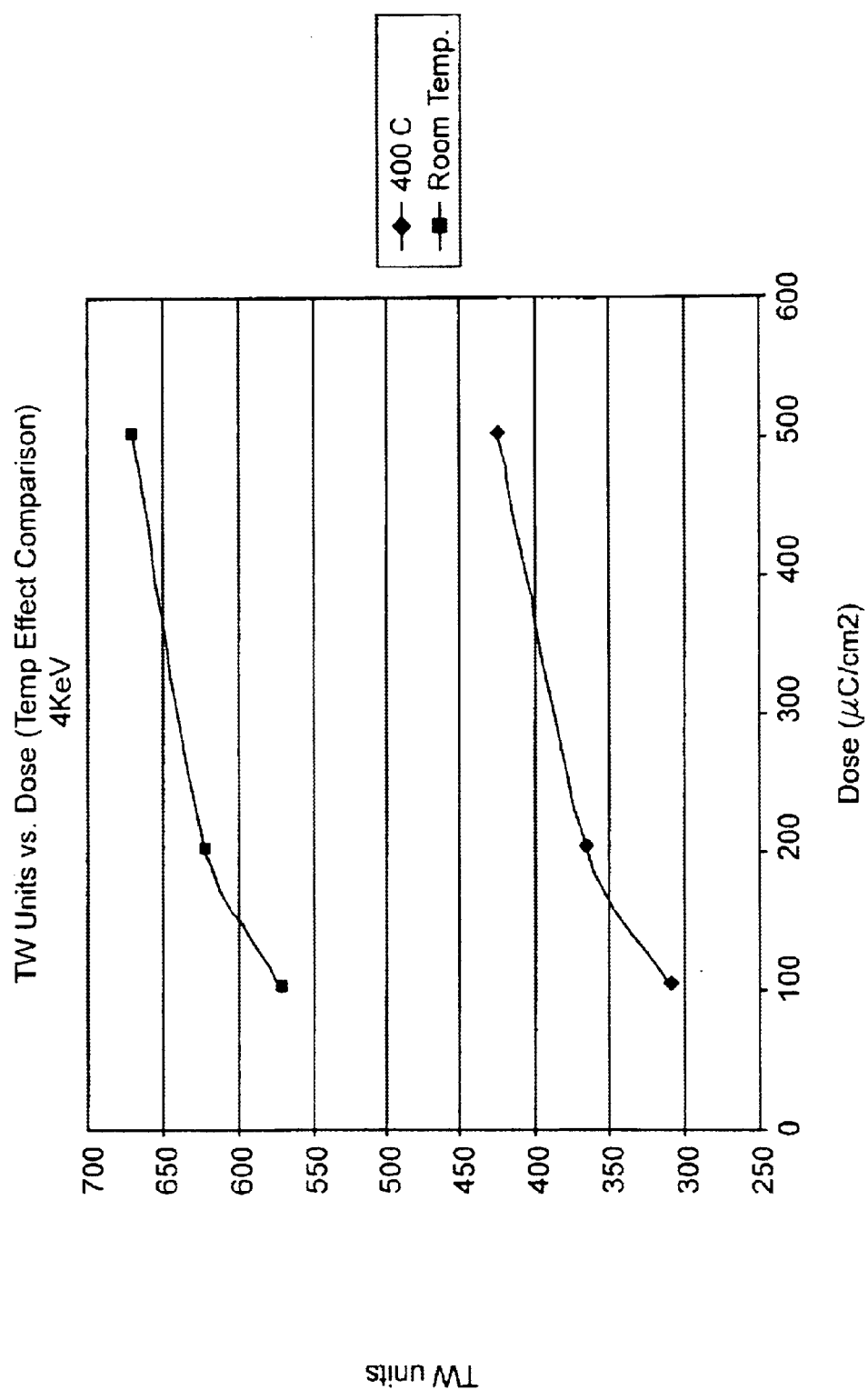
FIG. 5 shows curves of mean values of measurements made by a Therma-Probe®) monitor tool on electron beam treated wafers as a function of electron beam dose at different values of temperature.
Figure 6:
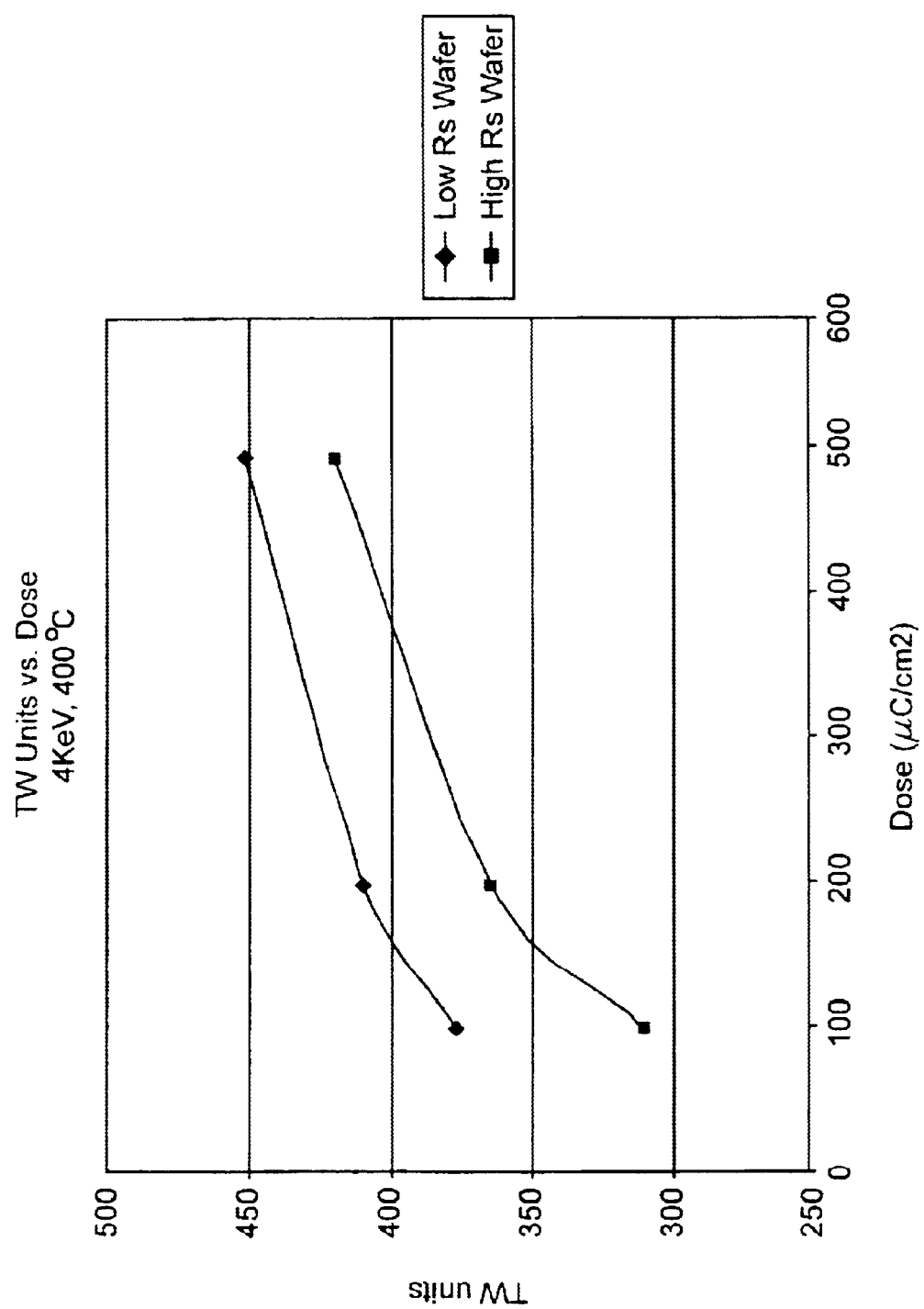
FIG. 6 shows curves of mean values of measurements made by a Therma-Probe® monitor tool on electron beam treated wafers as a function of wafer.

We have made thermal and/or plasma wave measurements of electron beam treated wafers utilizing a Therma- Probe® monitor tool, where the electron-beam treatment was carried out utilizing various e-beam treatment parameters. In particular, FIG. 4 shows curves of mean values of measurements made by a Therma-Probe®monitor tool on electron beam treated wafers as a function of electron beam dose at different values of cathode voltage; FIG. 5 shows curves of mean values of measurements made by a ThermaProbe® monitor tool on electron beam treated wafers as a function of electron beam dose at different values of temperature; and FIG. 6 shows curves of mean values of measurements made by a Therma-Probe® monitor tool on electron beam treated wafers as a function of wafer type. As one can readily appreciate from the above, the data shown in FIGS. 4–6 indicate that wafer type, dose, wafer temperature, and/or cathode voltage may affect thermal wave and/or plasma waves measurements. In light of the above, one or more embodiments of the present invention entail: (a) e-beam treating one or more of a predetermined type of wafer or substrate utilizing one or more sets of electron beam treatment parameters (for example, wafer temperature, electron beam dose, and electron beam energy —for example, by setting cathode voltage); (b) making post-electron beam treatment measurements of intensity of a probe beam reflected from the surface of the one or more wafers in which thermal and/or plasma waves have been induced; and (c) developing data from the post-electron beam treatment measurements such as, for example and without limitation, a mean of the measurements obtained from a wafer, that provide insight into performance of the electron beam treatment apparatus. In accordance with one such embodiment, one or more plots of such data (for example and without limitation, like the plots shown in FIGS. 4–6) may be utilized as a measure for characterizing an electron beam treatment apparatus. Such measures for characterizing an electron beam treatment apparatus may be utilized in accordance with one or more further embodiments of the present invention. For example, if one were to utilize an electron beam treatment apparatus in production, one would perform the same sets of measurements (before entering production, and after spending some time in production); then one would compare the data (before and after) to determine whether performance had changed. Such a comparison might entail determining whether a function of the differences between the data (for example and without limitation, the standard deviation) satisfied a predetermined criterion (for example and without limitation, the standard deviation was below a predetermined amount). Many other methods for comparing the data may be carried out. For example, if the difference between any group of data exceeded a predetermined amount, this might be considered unacceptable. Among other things, this comparison might be useful in determining whether maintenance was necessary. Similarly, such a procedure could be carried out after a repair to determine whether performance had changed. In further addition, such data may be useful in determining whether process changes such as, for example, length of treatment, temperature, and so forth, were necessary to provide a predetermined effective amount of electron beam treatment. In still further addition, such data may be useful in characterizing chamber-to-chamber matching of electron beam treatment apparatus. For example, by comparing such data for two electron beam treatment apparatus, one could determine whether and to what extent their performance matched each other. In still further addition, such data may be useful in hardware optimization relating to a piece of equipment such as, for example and without limitation, an anode, by examining the data obtained using different anodes to determine whether the different anodes affected performance.

In addition to the above, one or more embodiments of the present invention entail: (a) making pre-electron beam treatment measurements of intensity of a probe beam reflected from a surface of a predetermined type of wafer or substrate in which thermal and/or plasma waves have been induced; (b) e-beam treating the wafer or substrate utilizing a set of electron beam treatment parameters (for example, wafer temperature, electron beam dose, and electron beam energy —for example, by setting cathode voltage); (c) making post-electron beam treatment measurements of intensity of a probe beam reflected from the surface of the wafer or substrate in which thermal and/or plasma waves have been induced; (d) developing data that represent differences between pre- and post-electron beam treatment measurements; and (e) analyzing the data to provide a measure of electron beam uniformity. In accordance with one or more such embodiments of the present invention, the measure of electron beam uniformity provided by analyzing the data includes, for example and without limitation, one or more of the following: (a) a mean value of the data; (b) a standard deviation ($\sigma$) of the data; (c) a parameter equal to (maximum value-minimum value) of the data divided by 2 or 3 times the mean value of the data; (d) the standard deviation ($\sigma$) divided by the mean; and (e) so forth. Then, in accordance with one or more further such embodiments, the electron beam is deemed to be uniform by determining whether the measure of electron beam uniformity is less than a predetermined amount, for example and without limitation, whether the standard deviation ($\sigma$) divided by the mean is less than 0.008. In accordance with one or more embodiments of the present invention, a step of making measurements of intensity of a probe beam reflected from a surface of a wafer or substrate in which thermal and/or plasma waves have been induced includes using a Therma-Probe®D monitor tool to make thermal and/or plasma wave measurements at a predetermined number of points (for example and without limitation, 121 points) across a wafer.

One or more further embodiments of the present invention entail the use of standard wafer such as, for example and without limitation, a silicon wafer having predetermined parameters such as an industry standard, high resisitivity silicon wafer having 10–100 ohm-cm. Because such wafers are substantially uniform in their properties, measurements useful for characterizing electron beam uniformity may dispense with some of the above-described steps. As such, one or more such embodiments include: (a) e-beam treating a standard wafer or substrate utilizing a set of electron beam treatment parameters (for example, wafer temperature —for example room temperature, electron beam dose, and electron beam energy —for example, by setting cathode voltage); (b) making post-electron beam treatment measurements of intensity of a probe beam reflected from the surface of the wafer or substrate in which thermal and/or plasma waves have been induced; and (c) analyzing the measurements to provide a measure of electron beam uniformity. In accordance with one or more such embodiments of the present invention, the measure of electron beam uniformity provided by analyzing the measurements includes, for example and without limitation, one or more of the following: (a) a mean value of the measurements; (b) a standard deviation ($\sigma$) of the data; (c) a parameter equal to (maximum value-minimum value) of the data divided by 2 or 3 times the mean value of the data; (d) the standard deviation ($\sigma$) divided by the mean; and (e) so forth. Then, in accordance with one or more further such embodiments, the electron beam is deemed to be uniform by determining whether the measure of electron beam uniformity is less than a predetermined amount, for example and without limitation, whether the standard deviation (a) divided by the mean is less than 0.008. In accordance with one or more embodiments of the present invention, a step of making measurements of intensity of a probe beam reflected from a surface of a wafer or substrate in which thermal and/or plasma waves have been induced includes using a Therma-Probe® monitor tool to make thermal and/or plasma wave measurements at a predetermined number of points (for example and without limitation, 121 points) across a wafer.

Figure 7:
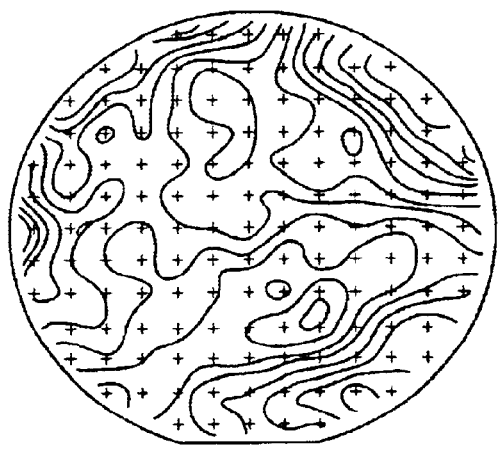
FIGS. 7–9 show a pre-electron beam treatment measurement map, a post-electron beam treatment measurement map, and a delta map for the pre- and post-electron beam treatment maps, respectively.
Figure 8:
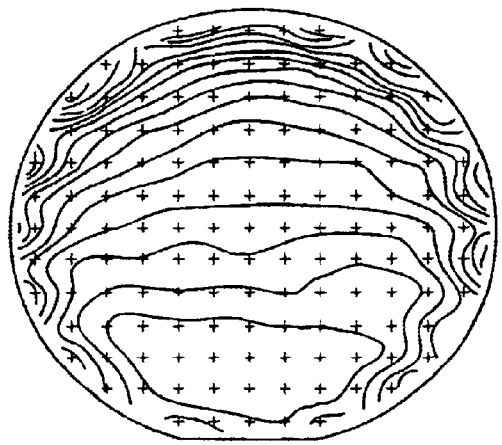
Figure 9:
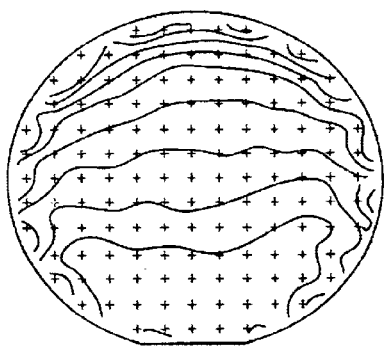

FIGS. 7–9 show a pre-electron beam treatment measurement map, a post-electron beam treatment measurement map, and a delta map for the pre- and post-electron beam treatment maps, respectively, where the pre- and post-electron beam treatment measurement maps where produced utilizing output from a Therma-Probe® monitor tool. The delta map shown in FIG. 9 represents the differences between measurements of the pre- and post-electron beam treatment maps shown in FIGS. 7 and 8, respectively. FIGS. 7–9 show: (a) data taken by Therma-Probe® monitor tool, at 121 points across a wafer; (b) the mean value of the data; (c) the standard deviation of the data; (d) the maximum value of the data; (e) the minimum value of the data; (f) the range of the data (i.e., maximum value−minimum value); (g) in percentage, the standard deviation divided by the mean; and (h) contours. In accordance with the displays shown in FIGS. 7–9: (a) contour interval is provided as a percentage of the mean; (b) points designated by "0" that occur roughly along a first line have values about equal to the mean; (c) points designated "+" that occur within an area bounded by a second line have values within the mean+the contour interval; (d) points designated "−" that occur within an area bounded by a third line have values within the mean−the contour interval; (e) and so forth across the map.

In accordance with one or more embodiments of the present invention, one may characterize electron beam uniformity for hardware optimization relating to a piece of equipment such as an anode by examining a measure of electron beam uniformity that is obtained according to any one of the above-described embodiments from electron beam treatments using different anodes. In accordance with such an embodiment, one examines the measure of electron beam uniformity as a function of the different equipment. In addition, in accordance with one or more embodiments of the present invention, one may carry out chamber-to-chamber matching of electron beam treatment apparatus by examining a measure of electron beam uniformity that is obtained according to any one of the above-described embodiments from electron beam treatments using two or more electron beam treatment apparatus to be matched. In accordance with such an embodiment, one examines the measure of electron beam uniformity as a function of the different chambers, and deems chambers to be matched when the measure of electron beam uniformity for the different chambers are within a predetermined distance from each other (for example, distance may be an amount or a percentage of a mean, and so forth).

Those skilled in the art will recognize that the foregoing description has been presented for the sake of illustration and description only. As such, it is not intended to be exhaustive or to limit the invention to the precise form disclosed.

What is claimed is:

1. A method for characterizing an electron beam treatment apparatus, the method comprising:
   e-beam treating one or more of a predetermined type of wafer or substrate utilizing one or more sets of electron beam treatment parameters;
   making post-electron beam treatment measurements of intensity of a probe beam reflected from the surface of the one or more wafers in which thermal and/or plasma waves have been induced; and
   developing data from the post-electron beam treatment measurements that provide insight into performance of the electron beam treatment apparatus.

2. The method of claim 1 wherein the one or more sets include various values of one or more of wafer temperature, electron beam dose, and electron beam energy.

3. The method of claim 2 wherein the data include plots of data as a function of one or more of wafer temperature, electron beam dose, and electron beam energy.

4. The method of claim 3 wherein the plots include mean values of the post-electron beam treatment measurements of intensity.

5. A method for characterizing an electron beam treatment apparatus at a first time and a second time, the method comprising:
   e-beam treating one or more of a predetermined type of wafer or substrate utilizing one or more sets of electron beam treatment parameters at the first time;
   making post-electron beam treatment measurements of intensity of a probe beam reflected from the surface of the one or more wafers in which thermal and/or plasma waves have been induced;
   developing data from the post-electron beam treatment measurements that provide insight into performance of the electron beam treatment apparatus at the first time;
   e-beam treating one or more of a predetermined type of wafer or substrate utilizing the one or more sets of electron beam treatment parameters at the second time;
   making post-electron beam treatment measurements of intensity of a probe beam reflected from the surface of the one or more wafers in which thermal and/or plasma waves have been induced;
   developing data from the post-electron beam treatment measurements that provide insight into performance of the electron beam treatment apparatus at the second time; and
   comparing the data from the first time and the second time.

6. A method for characterizing a first and a second electron beam treatment apparatus, the method comprising:
   e-beam treating one or more of a predetermined type of wafer or substrate utilizing the first electron beam treatment apparatus and utilizing one or more sets of electron beam treatment parameters;
   making post-electron beam treatment measurements of intensity of a probe beam reflected from the surface of the one or more wafers in which thermal and/or plasma waves have been induced;
   developing data from the post-electron beam treatment measurements that provide insight into performance of the first electron beam treatment apparatus;
   e-beam treating one or more of a predetermined type of wafer or substrate utilizing the second electron beam treatment apparatus and utilizing the one or more sets of electron beam treatment parameters;
   making post-electron beam treatment measurements of intensity of a probe beam reflected from the surface of the one or more wafers in which thermal and/or plasma waves have been induced;
   developing data from the post-electron beam treatment measurements that provide insight into performance of the second electron beam treatment apparatus; and comparing the data from the first and second electron beam treatment apparatus.

7. A method for characterizing an electron beam treatment apparatus the method comprising:

making pre-electron beam treatment measurements of intensity of a probe beam reflected from a surface of a predetermined type of wafer or substrate in which thermal and/or plasma waves have been induced;

electron beam treating the wafer or substrate utilizing a predetermined set of electron beam treatment parameters;

making post-electron beam treatment measurements of intensity of a probe beam reflected from the surface of the wafer or substrate in which thermal and/or plasma waves have been induced; and developing data that represent differences between pre- and post-treatment measurements.

8. The method of claim 7 wherein the steps of making measurements includes making measurements utilizing a Therma-Probe® monitor tool.

9. The method of claim 7 which further comprises:

analyzing the data to provide a measure of electron beam uniformity.

10. The method of claim 9 wherein the measure comprises one or more of: (a) a mean value of the data; (b) a standard deviation of the data; (c) a parameter equal to (maximum value−minimum value) of the data divided by 2 or 3 times the mean value of the data; and (d) the standard deviation of the data divided by the mean value of the data.

11. The method of claim 10 which further comprises determining whether a percentage of data within an interval is less than a predetermined amount.

12. The method of claim 11 wherein the interval is one standard deviation of the mean.

13. The method of claim 12 wherein the predetermined amount is 0.8%.

14. A method for characterizing an electron beam treatment apparatus, the method comprising:

electron beam treating a standard silicon wafer utilizing a predetermined set of electron beam treatment parameters;

making post-electron beam treatment measurements of intensity of a probe beam reflected from the surface of the wafer in which thermal and/or plasma waves have been induced; and analyzing the measurements to provide a measure of electron beam uniformity.

15. A method for characterizing an electron beam treatment apparatus, the method comprising:

inducing a localized periodic heating and/or periodic plasma density at an area at a multiplicity of points on a surface of a wafer;

directing a radiation probe beam within a portion of the area periodically heated so the radiation probe beam reflects off the surface of the wafer;

measuring the intensity variations of the reflected radiation probe beam resulting from the periodic changes in reflectivity of the wafer induced by the periodic heating;

electron beam treating the wafer utilizing a predetermined set of electron beam treatment parameters;

inducing a localized periodic heating and/or periodic plasma density at an area at a multiplicity of points on a surface of the electron beam treated wafer;

directing a radiation probe beam within a portion of the area periodically heated so the radiation probe beam reflects off the surface of the electron beam treated wafer;

measuring the intensity variations of the reflected radiation probe beam resulting from the periodic changes in reflectivity of the electron beam treated wafer induced by the periodic heating; and subtracting the intensity variations at the multiplicity of points before and after the electron beam treatment.

16. The method of claim 15 wherein directing a radiation probe beam comprises directing the probe beam at the center of the area periodically heated.

17. The method of claim 15 where inducing comprises directing an intensity modulated laser beam.

18. The method of claim 17 wherein the radiation probe beam is directed to be coincident with the intensity modulated laser beam.

19. The method of claim 18 wherein the intensity modulated laser beam and the radiation probe are focused to a spot size of 1 micron in diameter.

20. The method of claim 15 wherein measuring includes detecting utilizing a photodetector.

21. A method of chamber-to-chamber matching electron beam treatment apparatus, the method comprising:

for a first predetermined type of wafer or substrate, making pre-electron beam treatment measurements of intensity of a probe beam reflected from a surface of the wafer in which thermal and/or plasma waves have been induced;

electron beam treating the wafer utilizing a predetermined set of electron beam treatment parameters in a first electron beam treatment apparatus;

making post-electron beam treatment measurements of intensity of a probe beam reflected from the surface of the wafer or substrate in which thermal and/or plasma waves have been induced;

developing data that represent differences between pre- and post-treatment measurements;

analyzing the data to provide a first measure of electron beam uniformity;

for a second wafer of the predetermined type, making pre-electron beam treatment measurements of intensity of a probe beam reflected from a surface of the wafer in which thermal and/or plasma waves have been induced;

electron beam treating the wafer utilizing the predetermined set of electron beam treatment parameters;

making post-electron beam treatment measurements of intensity of a probe beam reflected from the surface of the wafer in which thermal and/or plasma waves have been induced;

developing data that represent differences between pre- and post-treatment measurements;

analyzing the data to provide a second measure of electron beam uniformity; and comparing the first and second measures of electron beam uniformity.

* * * * *